(12) United States Patent
Matsuyama et al.

(10) Patent No.: US 12,095,434 B2
(45) Date of Patent: Sep. 17, 2024

(54) CURRENT DISTORTION REDUCTION APPARATUS

(71) Applicant: DAIKIN INDUSTRIES, LTD., Osaka (JP)

(72) Inventors: Ryou Matsuyama, Osaka (JP); Reiji Kawashima, Osaka (JP); Masaki Kouno, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 17 days.

(21) Appl. No.: 18/006,616

(22) PCT Filed: Jul. 20, 2021

(86) PCT No.: PCT/JP2021/027140
§ 371 (c)(1),
(2) Date: Jan. 24, 2023

(87) PCT Pub. No.: WO2022/030246
PCT Pub. Date: Feb. 10, 2022

(65) Prior Publication Data
US 2023/0275571 A1    Aug. 31, 2023

(30) Foreign Application Priority Data
Aug. 3, 2020 (JP) ................. 2020-131882

(51) Int. Cl.
*H03H 11/04* (2006.01)
(52) U.S. Cl.
CPC .............. *H03H 11/04* (2013.01); *Y02E 40/20* (2013.01)

(58) Field of Classification Search
CPC ......... H03H 11/04; Y02E 40/20; Y02E 40/40; F24F 8/10; H02J 3/01; H02J 1/02
See application file for complete search history.

(56) References Cited

U.S. PATENT DOCUMENTS 11,577,186 B2 * 2/2023 Kono ...................... F24F 8/192
2020/0129896 A1   4/2020 Kono et al.

FOREIGN PATENT DOCUMENTS

| JP | 2018-207662 | 12/2018 | |
| JP | 2019-022439 | 2/2019 | |
| WO | WO-2019017373 A1 * | 1/2019 | ............. B01D 35/06 |

OTHER PUBLICATIONS

International Preliminary Report on Patentability for PCT/JP2021/027140 mailed on Feb. 16, 2023.

(Continued)

*Primary Examiner* — Jung Kim
(74) *Attorney, Agent, or Firm* — IPUSA, PLLC

(57) ABSTRACT

A technology that can reduce the influence of variations in the reference potential of each current output device on the operation of multiple current output devices, when using the multiple current output devices to reduce the distortion of the load current, is provided. A plurality of active filters 41 to 43 are configured to reduce distortion of a load current supplied from the AC power supply 10 to the load device 20, based on a detection signal output from the load current sensor 30, the detection signal relating to the distortion of the load current; and the signal transmitting unit 44 configured to cause the plurality of active filters 41 to 43 to acquire a signal relating to the distortion of the load current, to reduce influence due to variation of a standard potential of the plurality of active filters 41 to 43, based on the detection signal output from the load current sensor 30.

7 Claims, 7 Drawing Sheets

(56) References Cited

OTHER PUBLICATIONS

International Search Report for PCT/JP2021/027140 mailed on Sep. 7, 2021.

\* cited by examiner

CURRENT DISTORTION REDUCTION APPARATUS

TECHNICAL FIELD

The present disclosure relates to a current distortion reduction apparatus.

BACKGROUND ART

Conventionally, a technique to reduce distortion (for example, harmonic components) of a load current supplied from an AC (alternating current) power supply to the load device by using multiple current output devices (active filters), has been known (see Patent Literature 1).

CITATION LIST

Patent Literature

[PTL 1]
Japanese Laid-Open Patent application no. 2018-207662

SUMMARY OF INVENTION

Technical Problem

However, in Patent Literature 1, the detection result of a current sensor for identifying the state of distortion of the load current is shared among multiple active filters through a signal line. Therefore, for example, when the reference potentials of multiple active filters are connected to each other, a current may flow between the active filters due to variations in the reference potential of each active filter. Further, for example, noise caused due to variations in the reference potential of each active filter may be included in the detection results shared through the signal line. As a result, the operation of each active filter may be adversely affected.

The object of the present disclosure is to provide a technology that can reduce the influence of variations in the reference potential of each current output device on the operation of multiple current output devices, when using the multiple current output devices to reduce the distortion of the load current.

Solution to Problem

One embodiment of the present disclosure provides
a current distortion reduction apparatus including
a plurality of current distortion reduction units configured to reduce distortion of a load current supplied from an AC power supply to a predetermined load device, based on a detection signal output from a predetermined detecting unit, the detection signal relating to the distortion of the load current; and
a reference potential variation influence reduction unit configured to cause the plurality of current distortion reduction units to acquire a signal relating to the distortion of the load current, to reduce influence due to variation of a standard potential of the plurality of current distortion reduction units, based on the detection signal output from the predetermined detecting unit.

According to the present embodiment, the current distortion reduction apparatus can reduce the influence of variations in the reference potential of each current distortion reduction unit (current output device) on the operation of multiple current distortion reduction units.

Further, in the above embodiment,
the reference potential variation influence reduction unit electrically may insulate the signal relating to the distortion of the load current based on the detection signal, and cause the plurality of current distortion reduction units to acquire the signal.

Further, in the above embodiment,
the reference potential variation influence reduction unit may transmit the signal relating to the distortion of the load current based on the detection signal, to the plurality of current distortion reduction units by radio communication.

Further, in the above embodiment,
the reference potential variation influence reduction unit may convert the signal relating to the distortion of the load current based on the detection signal, into an optical signal, and transmit the optical signal to the plurality of current distortion reduction units.

Further, in the above embodiment,
the reference potential variation influence reduction unit may perform differential amplification on a voltage corresponding to the signal relating to the distortion of the load current based on the detection signal, and cause the plurality of current distortion reduction units to acquire the voltage.

Further, in the above embodiment,
the signal relating to the distortion of the load current may be a signal representing the load current, a signal representing a sum of or a difference between phases of the load current, a signal relating to a distortion component of the load current, or a signal relating to a compensation current configured to reduce the distortion of the load current.

Advantageous Effects of Invention

According to the above embodiment, a technology that can reduce the influence of variations in the reference potential of each current output device on the operation of multiple current output devices, when using the multiple current output devices to reduce the distortion of the load current, can be provided.

DESCRIPTION OF EMBODIMENTS

Embodiments will be described below with reference to the drawings.

First Embodiment

First, the first embodiment will be described with reference to FIG. 1.

Figure 1:
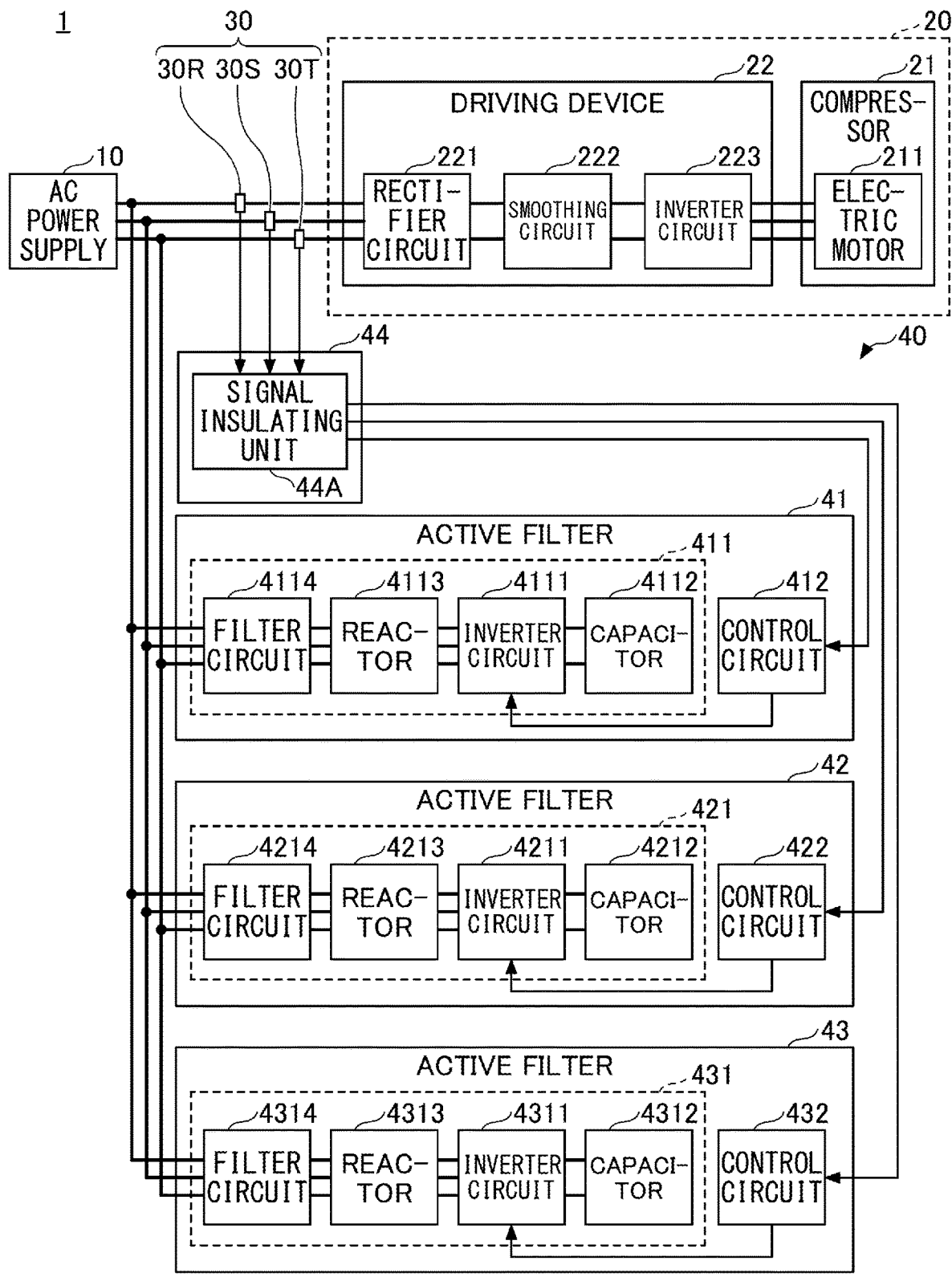
FIG. 1 is a diagram illustrating an example of a driving system according to the first embodiment.

FIG. 1 is a diagram illustrating an example of a driving system 1 according to the first embodiment. The thick solid lines in the figure represent the power transmission path, and the thin solid lines represent the signal transmission path. The same applies to FIGS. 2 to 7 below.

The driving system 1 drives a compressor 21 (an electric motor 211) included in a load device 20.

As illustrated in FIG. 1, the driving system 1 according to the first embodiment includes an AC (alternating current) power supply 10, the load device 20, a load current sensor 30, and a current distortion reduction apparatus 40.

The AC power supply 10 supplies AC power to the load device 20.

The load device 20 is electrically driven by power supplied from the AC power supply 10.

The load device 20 includes the compressor 21 and a driving device 22.

The compressor 21 is installed in an air conditioner, for example, to compress a refrigerant.

The compressor 21 includes an electric motor 211.

The electric motor 211 rotationally drives the compression mechanism of the compressor 21. The electric motor 211 is installed inside the housing of the compressor 21, for example.

The driving device 22 drives the compressor 21 (the electric motor 211) by using power supplied from the AC power supply 10.

The driving device 22 includes a rectifier circuit 221, a smoothing circuit 222, and an inverter circuit 223.

The rectifier circuit 221 rectifies the AC power supplied from the AC power supply 10 and outputs predetermined DC (direct current) power to the smoothing circuit 222. The rectifier circuit 221 is, for example, a bridge-type full-wave rectifier circuit in which six diodes are formed in a bridge shape.

The smoothing circuit 222 smooths the DC power output from the rectifier circuit 221. The smoothing circuit 222 includes, for example, a smoothing capacitor arranged in a power path connecting between the positive and negative bus wires, a DC reactor arranged in the positive bus wire, etc.

The inverter circuit 223 generates three-phase AC power from DC power supplied from the smoothing circuit 222 and supplies the generated three-phase AC power to the electric motor 211 to electrically drive the electric motor 211. The inverter circuit 223 is mainly configured by a bridge circuit, for example. In the bridge circuit, three switching legs are arranged in parallel so as to connect between the positive and negative bus wires. In each switching leg, two arms are arranged in series. Each of the arms is configured by arranging a switching element and a circulating diode in parallel. Then, the three-phase AC output terminals (the U-phase output terminal, the V-phase output terminal, and the W-phase output terminal) are drawn out from the midpoint between the upper and lower arms of each of the three switching legs of the inverter circuit 223.

The load current sensor 30 (an example of a detecting unit) detects the current (hereafter, "load current") supplied from the AC power supply 10 to the load device 20.

The load current sensor 30 includes, for example, a load current sensor 30R, a load current sensor 30S, and a load current sensor 30T that respectively detect the load current of the three-phase power paths (R, S, and T phase lines) between the AC power supply 10 and the load device 20.

Further, any one of the load current sensor 30R, the load current sensor 30S, or the load current sensor 30T may be omitted. This is because, based on the detection value of the load current of two of the three phases, it is possible to estimate the load current of the other one of the phases.

The detection signal (an example of a detection signal relating to the distortion of the load current) of the load current sensor 30 (the load current sensors 30S, 30R, and 30T) is input to a signal transmitting unit 44 described later.

In place of, or in addition to, the load current sensor 30, another sensor capable of outputting a detection signal relating to the distortion of the load current may be provided. For example, another sensor is a voltage sensor that detects a voltage representing the distortion of the load current.

The current distortion reduction apparatus 40 reduces the distortion of the load current supplied from the AC power supply 10 to the load device 20. For example, the current distortion reduction apparatus 40 reduces the harmonic components superimposed on the load current supplied from the AC power supply 10 to the load device 20, thereby bringing the waveform of the load current closer to the sine wave of the basic frequency.

The current distortion reduction apparatus 40 includes a plurality (in this example, three) of active filters 41 to 43 and the signal transmitting unit 44.

Note that the number of active filters included in the current distortion reduction apparatus 40 may also be two or four or more.

Based on the detection signal of the load current sensor 30, the active filters 41 to 43 (an example of a plurality of current distortion reduction units) outputs a current (hereafter, "compensation current") for reducing distortion of the load current supplied from the AC power supply 10 to the load device 20. The output of the compensation current can include both of the following cases, that is, a case where the compensation current is supplied to the power path (R, S, and T phase lines) between the AC power supply 10 and the load device 20, and a case where the compensation current is absorbed from the power path between the AC power supply 10 and the load device 20. Specifically, the active filters 41 to 43 repeat the supply or absorption of the compensation current with respect to the power path between the AC power supply 10 and the load device 20 so as to reduce the distortion (for example, harmonic components) of the load current supplied from the AC power supply 10 to the load device 20. Thus, the active filters 41 to 43, as a whole, can output a compensation current in an opposite phase to that of the distortion component of the load current (for example, harmonic components) with respect to the power path between the AC power supply 10 and the load device 20, thereby reducing (cancelling) the distortion of the load current.

The active filter 41 includes a current output circuit 411 and a control circuit 412.

The current output circuit 411 includes an inverter circuit 4111, a capacitor 4112, a reactor 4113, and a filter circuit 4114.

Under the control of the control circuit 412, the inverter circuit 4111 generates three-phase AC power by using the DC power of the capacitor 4112, and supplies a compensation current to the power path between the AC power supply 10 and the load device 20 through the reactor 4113 and the filter circuit 4114. Further, under the control of the control circuit 412, the inverter circuit 4111 absorbs the compensation current from the power path between the AC power supply 10 and the load device 20 through the reactor 4113 and the filter circuit 4114, converts the compensation current into DC power, and stores the DC power in the capacitor 4112. The inverter circuit 4111 is mainly configured by a bridge circuit, for example. In the bridge circuit, three switching legs are arranged in parallel so as to connect between the positive and negative bus wires. In each switching leg, two arms are arranged in series. Each of the arms is configured by arranging a switching element and a circulating diode in parallel. Then, the three-phase AC output terminals (the R-phase output terminal, the S-phase output terminal, and the T-phase output terminal) are drawn out from the midpoint between the upper and lower arms of each of the three switching legs of the inverter circuit 4111.

The capacitor 4112 is arranged between the positive and negative bus wires of the input side (DC side) of the inverter circuit 4111.

The reactor 4113 is arranged in series with each of the power paths (the R-phase line, the S-phase line, and the T-phase line) on the output side (AC side) of the inverter circuit 4111.

The filter circuit 4114 is arranged in each of the power paths (the R-phase line, the S-phase line, and the T-phase line) in the rear stage of the reactor 4113 as viewed from the inverter circuit 4111. The filter circuit 4114 is, for example, an LC filter configured by a reactor, a capacitor, and the like.

The control circuit 412 controls the current output circuit 411 based on a signal input from the signal transmitting unit 44 relating to the distortion of the load current and causes the current output circuit 411 to output a compensation current. Specifically, the control circuit 412 may output a compensation current from the current output circuit 411 by driving the switching element of the inverter circuit 4111 to be turned on and off.

The function of the control circuit 412 may be implemented by any piece of hardware or any combination of hardware and software, etc. The control circuit 412 may be configured to be centering around a computer including, for example, a CPU (Central Processing Unit), a memory device (main memory) such as a RAM (Random Access), a non-volatile auxiliary storage device such as a ROM (Read Only Memory), and an interface device for performing input and output to and from an external device.

The active filter 42 includes a current output circuit 421 and a control circuit 422.

The current output circuit 421 includes an inverter circuit 4211, a capacitor 4212, a reactor 4213, and a filter circuit 4214.

The configuration of the active filter 42 is the same as that of the active filter 41, so a detailed description is omitted.

The active filter 43 includes a current output circuit 431 and a control circuit 432.

The current output circuit 431 includes an inverter circuit 4311, a capacitor 4312, a reactor 4313, and a filter circuit 4314.

The configuration of the active filter 43 is the same as that of the active filters 41 and 42, so a detailed description is omitted.

For example, when multiple active filters are controlled by a single control unit, the control system of multiple active filters may become complicated. This is because even if the compensation current output from each active filter is the same, the control signal for each active filter needs to be corrected so that unbalanced current output does not occur due to variations in components of each active filter.

On the other hand, one of the control circuits 412, 422, and 432 is provided for each of the active filters 41 to 43, and each of the active filters 41 to 43 is controlled by the corresponding control circuit 412, 422, 432. This can reduce the complexity of the control system of the active filters 41 to 43.

The signal transmitting unit 44 (an example of a reference potential variation influence reduction unit) transmits a signal relating to the distortion of the load current to the active filters 41 to 43 (the control circuits 412, 422, 432) based on the input detection signal of the load current sensor 30 (the load current sensors 30R, 30S, 30T).

The signal relating to the distortion of the load current may include, for example, a signal representing the load current detected by the load current sensor 30. The signal representing the load current may be a signal representing each load current in the current path (the R, S, and T phase lines) of the three-phase AC. In this case, the signal representing the load current may be the detection signal itself of the load current sensor 30 (the load current sensor 30R, 30S, 30T). Further, the signal representing the load current may be a signal representing each of a d-axis current and a q-axis current corresponding to the load current, calculated based on the detection signal of each load current of the three-phase AC. Further, the signal relating to the distortion of the load current may include, for example, a signal representing the sum of the load currents of two of the three phases or the difference in the load current between two of the three phases. Further, the signal relating to the distortion of the load current may include, for example, a signal relating to the distortion component of the load current. The signal relating to the distortion component of the load current may be, for example, a signal representing the harmonic component (harmonic current) included in the load current. The signal relating to the distortion component of the load current may be, for example, a signal representing the harmonic current distortion ratio (THD: total harmonic distortion) of the load current. Further, the signal relating to the distortion component of the load current may be, for example, a signal representing the AC component of the d-axis current corresponding to the load current and the q-axis current (the DC component and the AC component), respectively.

The signal transmitting unit 44 includes a signal insulating unit 44A.

The signal insulating unit 44A insulates and outputs a signal relating to the distortion of the load current, and the output signal is input to each of the active filters 41 to 43. This insulates the reference potential on the input side of the signal insulating unit 44A from the reference potential on the output side, that is, from each reference potential of the active filters 41 to 43.

The signal insulating unit 44A may include, for example, an isolator of the optically coupling type (for example, a photocoupler, etc.) that transfers optical signals between isolated light-emitting elements and light-receiving elements on the input and output sides. The signal insulating unit 44A may also include, for example, an isolator of a magnetic coupling (induction) type that transfers signals by magnetic coupling between isolated coils on the input and output sides. The signal insulating unit 44A may also include, for example, an isolator of the capacitive coupling type that transfers an AC signal through an isolated capacitor. Further, the signal insulating unit 44A may include an isolator of a type that transfers signals by using electromagnetic waves between the isolated input and output sides. Further, the signal insulating unit 44A may include an isolator of a type that transfers signals by using radio communication.

For example, when a signal relating to the distortion of the load current is distributed to the active filters 41 to 43, if the reference potentials of the transmitting and receiving sides of the signal are connected, noise due to variations in the reference potential of the active filters 41 to 43 may be superimposed on the transmitted signal. Further, the reference potentials of the active filters 41 to 43 are connected to each other at the transmitting side of the signal, and there is a possibility that a current flows between the active filters due to variations in the reference potentials of the respective active filters 41 to 43. As a result, the operation of the active filters 41 to 43 may be adversely affected.

On the other hand, in the first embodiment, the signal transmitting unit 44 (the signal insulating unit 44A) can insulate signals relating to the distortion of the load current and output (transmit) the signals to the active filters 41 to 43. Therefore, the influence of the variation of the reference potential of the active filters 41 to 43 on the transmitted signal (the signal relating to the distortion of the load current) can be reduced. The reference potentials of the active filters 41 to 43 are not connected to each other on the transmitting side, and, therefore, a situation in which a current flows between the active filters 41 to 43 due to variations in each reference potential can be prevented. Therefore, the influence on the operation of the active filters 41 to 43 due to the variation of the reference potential of each of the active filters 41 to 43 can be reduced.

The function of the signal insulating unit 44A may be provided for each active filters 41 to 43. For example, an isolator may be provided inside each of the active filters 41 to 43. In this case, the signal relating to the distortion of the load current may be input to each of the active filters 41 to 43 by an electrical signal line and may also be taken into each of the control circuits 412, 422, 432 through an isolator. In this way, the same functions and effects can be attained.

Second Embodiment

Next, the second embodiment will be described with reference to FIG. 2. Hereafter, the explanation will be mainly on the different parts from the first embodiment, and the explanation on the same or corresponding content as the first embodiment may be simplified or omitted.

Figure 2:
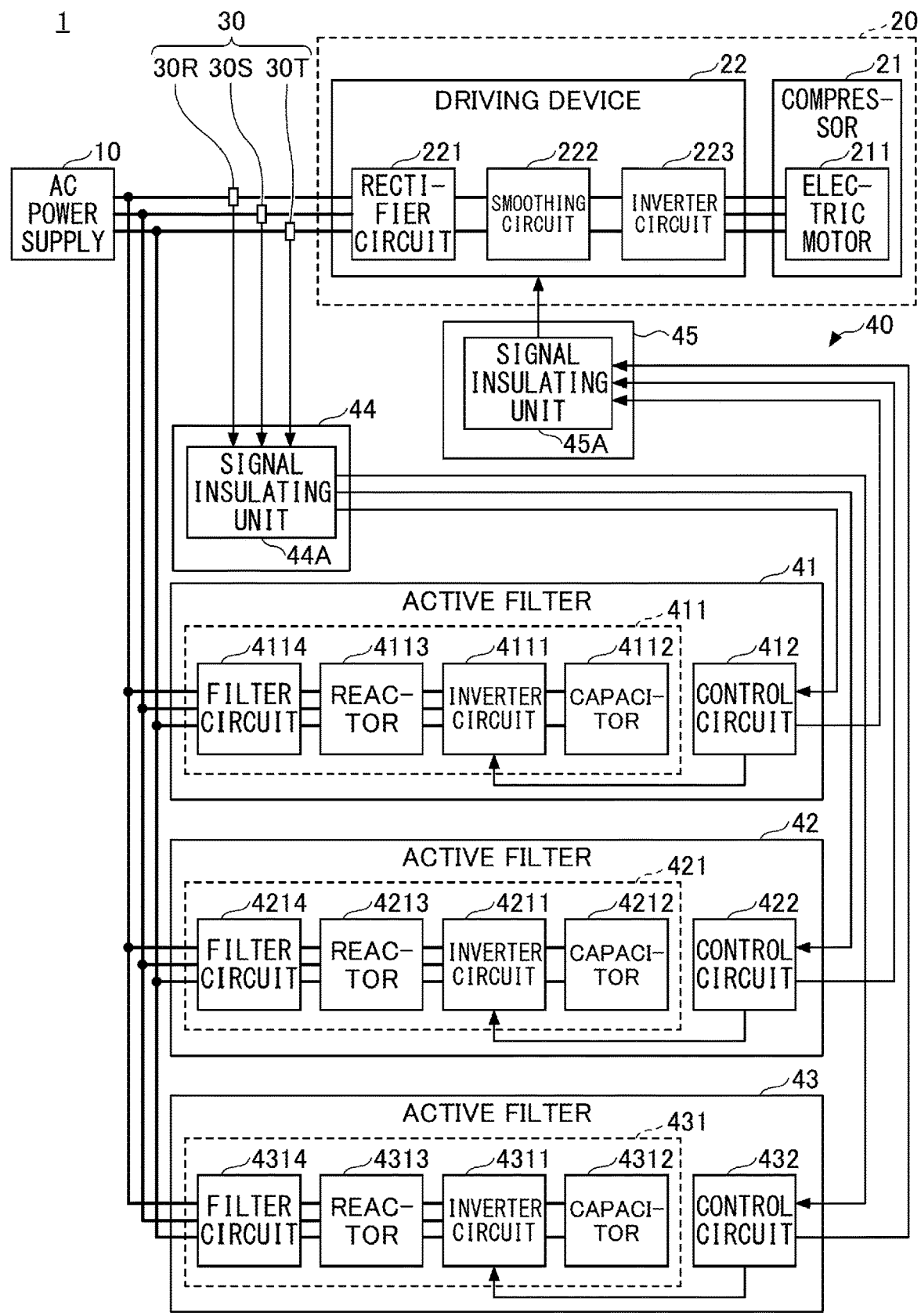
FIG. 2 is a diagram illustrating an example of the driving system according to the second embodiment.

FIG. 2 illustrates an example of the driving system 1 according to the second embodiment.

As illustrated in FIG. 2, the driving system 1 according to the second embodiment includes the AC power supply 10, the load device 20, the load current sensor 30, and the current distortion reduction apparatus 40, as in the first embodiment.

As in the first embodiment, the current distortion reduction apparatus 40 includes a plurality (in this example, three) of the active filters 41 to 43 and the signal transmitting unit 44. Further, the current distortion reduction apparatus 40 includes a signal transmitting unit 45.

The active filter 41 includes the current output circuit 411 and the control circuit 412, as in the first embodiment.

As in the first embodiment, the current output circuit 411 includes the inverter circuit 4111, the capacitor 4112, the reactor 4113, and the filter circuit 4114.

The control circuit 412 controls the current output circuit 411 based on a signal relating to the distortion of the load current input from the signal transmitting unit 44 and causes the current output circuit 411 to output a compensation current.

The control circuit 412 also outputs a signal relating to the operation status of the active filter 41 to the driving device 22 through the signal transmitting unit 44. Thus, the control circuit of the driving device 22 can identify the operation status of the active filter 41. The same applies to the control circuit 422, 432 below.

The active filter 42 includes the current output circuit 421 and the control circuit 422, as in the first embodiment.

As in the first embodiment, the current output circuit 421 includes the inverter circuit 4211, the capacitor 4212, the reactor 4213, and the filter circuit 4214.

The active filter 43 includes the current output circuit 431 and the control circuit 432, as in the first embodiment.

As in the first embodiment, the current output circuit 431 includes the inverter circuit 4311, the capacitor 4312, the reactor 4313, and the filter circuit 4314.

Based on an input detection signal of the load current sensor 30 (the load current sensor 30R, 30S, 30T), the signal transmitting unit 44 transmits a signal relating to the distortion of the load current to the active filters 41 to 43 (the control circuit 412, 422, 432).

As in the first embodiment, the signal transmitting unit 44 includes the signal insulating unit 44A. Thus, the signal transmitting unit 44 (the signal insulating unit 44A) can insulate the signal relating to the distortion of the load current and output (transmit) the signal to the active filters 41 to 43 as in the first embodiment. Therefore, the influence on the operation of the active filters 41 to 43 due to the variation of the reference potential of each of the active filters 41 to 43 can be reduced.

The signal transmitting unit 45 transmits, to the driving device 22, a signal relating to the operation status input from each of the active filters 41 to 43.

The signal transmitting unit 45 includes a signal insulating unit 45A.

The signal insulating unit 45A insulates and outputs signals relating to the operation status input from each of the active filters 41 to 43, and the output signals are input to the driving device 22. As a result, the reference potential on the input side of the signal insulating unit 45A, that is, the respective reference potentials of the active filters 41 to 43, and the reference potential on the output side, are insulated.

The signal insulating unit 45A, similar to the signal insulating unit 44A, may include an isolator of, for example, an optical coupling type, a magnetic coupling (induction) type, a capacitive coupling type, a type for transferring signals by using electromagnetic waves, a type for transferring signals by using radio communication, or the like.

For example, when a signal relating to the operation status of the active filters 41 to 43 is transmitted to the driving device 22 and the reference potentials of the transmitting and receiving sides of the signal are connected, noise due to variations in the reference potential of the active filters 41 to 43 may be superimposed on the transmitted signal. Further, the reference potentials of the active filters 41 to 43 are connected to each other on the receiving side of the signal, and a current may flow between the active filters due to variations in the reference potentials of the respective active filters 41 to 43. As a result, the operation of the active filters 41 to 43 may be adversely affected.

On the other hand, in the second embodiment, the signal transmitting unit 45 (the signal insulating unit 45A) can insulate signals relating to the respective operation statuses of the active filters 41 to 43 and output (transmit) the signals to the driving device 22. Therefore, the influence of the variation of the reference potential of the active filters 41 to 43 on the transmitted signal (the signal relating to the operation status) can be reduced. The reference potentials of the active filters 41 to 43 are not connected to each other on the receiving side, and, therefore, a situation in which a current flows between the active filters 41 to 43 due to variations in each reference potential can be prevented. Therefore, the influence on the operation of the active filters 41 to 43 due to the variation of the reference potential of each of the active filters 41 to 43 can be reduced.

The signal transmitting unit 44 and the signal transmitting unit 45 may be formed as one unit. For example, the signal transmitting unit 44 and the signal transmitting unit 45 may be implemented by the same substrate (that is, one substrate).

Third Embodiment

Next, a third embodiment will be described with reference to FIG. 3. Hereafter, the explanation will be mainly on the different parts from the first embodiment, etc., and the explanation about the same or corresponding content as the first embodiment, etc., may be simplified or omitted.

Figure 3:
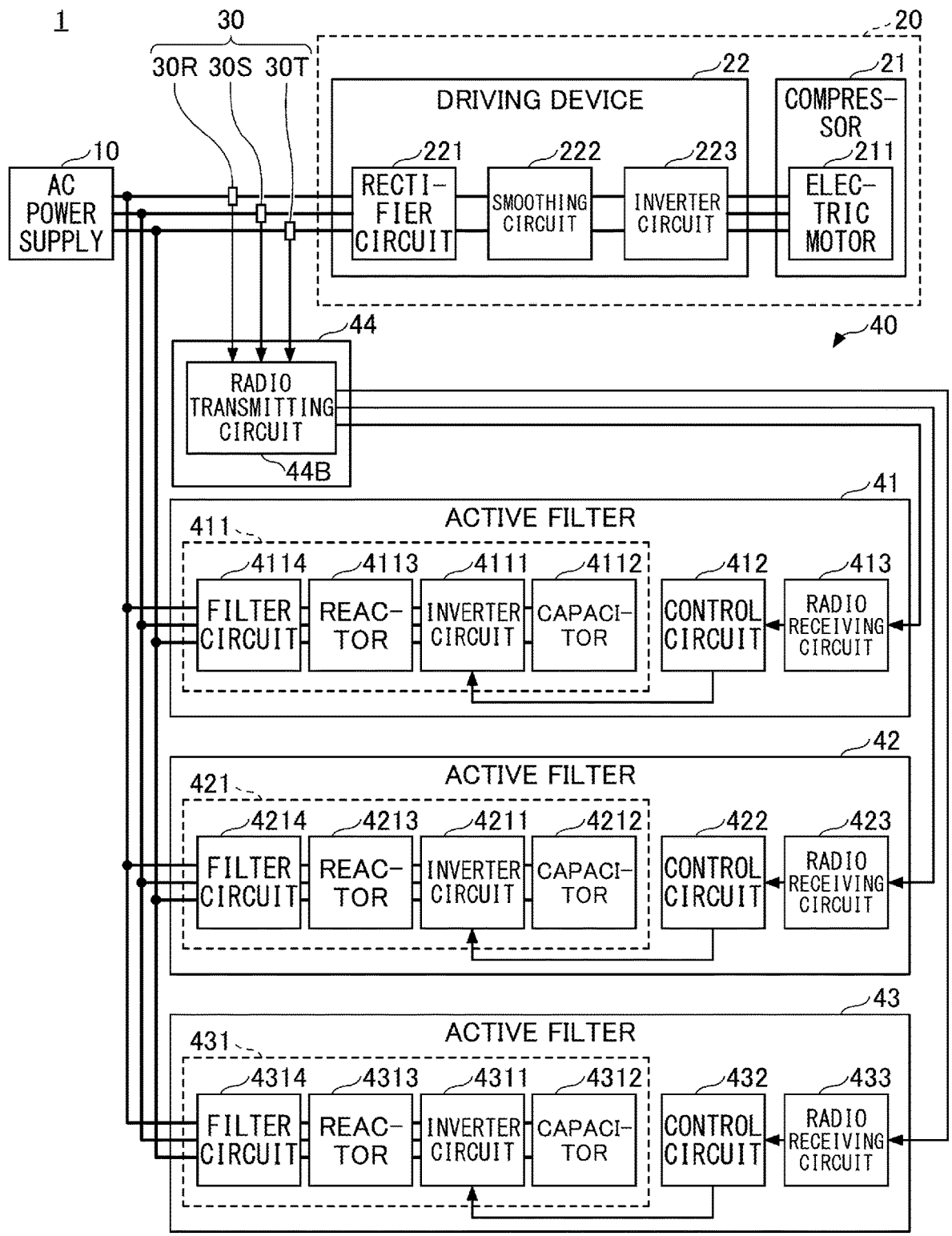
FIG. 3 is a diagram illustrating an example of the driving system according to the third embodiment.

FIG. 3 is a diagram illustrating an example of the driving system 1 according to the third embodiment.

As illustrated in FIG. 3, the driving system 1 according to the third embodiment includes the AC power supply 10, the load device 20, the load current sensor 30, and the current distortion reduction apparatus 40, as in the first embodiment.

The current distortion reduction apparatus 40 includes a plurality (in this example, three) of the active filters 41 to 43 and the signal transmitting unit 44 as in the first embodiment and the like.

The active filter 41 includes the current output circuit 411 and the control circuit 412 as in the first embodiment and the like. Further, the active filter 41 includes a radio receiving circuit 413.

The current output circuit 411 includes the inverter circuit 4111, the capacitor 4112, the reactor 4113, and the filter circuit 4114, as in the first embodiment.

The radio receiving circuit 413 receives a signal (a signal relating to the distortion of the load current) transmitted from the signal transmitting unit 44 (a radio transmitting circuit 44B) by using a predetermined radio communication method. The radio communication method used may be, for example, Wi-Fi, Bluetooth (registered trademark), NFC (Near Field Communication), ZigBee, EnOcean, etc. The radio receiving circuit 413 receives a signal destined to the active filter 41 from the radio transmitting circuit 44B, and the received signal is taken into the control circuit 412.

The active filter 42 includes the current output circuit 421 and the control circuit 422 as in the first embodiment and the like. Further, the active filter 42 includes a radio receiving circuit 423.

The current output circuit 421 includes the inverter circuit 4211, the capacitor 4212, the reactor 4213, and the filter circuit 4214, as in the first embodiment.

The radio receiving circuit 423, similar to the radio receiving circuit 413, receives a signal (signal relating to the distortion of the load current) transmitted from the signal transmitting unit 44 (the radio transmitting circuit 44B) by using a predetermined radio communication method. The radio receiving circuit 423 receives a signal destined to the active filter 42 from the radio transmitting circuit 44B, and the received signal is taken into the control circuit 422.

The active filter 43 includes the current output circuit 431 and the control circuit 432 as in the first embodiment and the like. The active filter 43 also includes a radio receiving circuit 433.

The current output circuit 431 includes the inverter circuit 4311, the capacitor 4312, the reactor 4313, and the filter circuit 4314, as in the first embodiment.

The radio receiving circuit 433, similar to the radio receiving circuit 413 and 423, receives a signal (a signal relating to the distortion of the load current) transmitted from the signal transmitting unit 44 (the radio transmitting circuit 44B) by using a predetermined radio communication method. The radio receiving circuit 433 receives a signal destined to the active filter 43 from the radio transmitting circuit 44B, and the received signal is taken into the control circuit 432.

The signal transmitting unit 44 transmits a signal relating to the distortion of the load current to the active filters 41 to 43 (the control circuit 412, 422, 432) based on the input detection signal of the load current sensor 30 (the load current sensor 30R, 30S, 30T) as in the first embodiment, etc.

The signal transmitting unit 44 includes the radio transmitting circuit 44B.

The radio transmitting circuit 44B transmits a signal relating to the distortion of load current based on the detection signal of the load current sensor 30, to each of the active filters 41 to 43 (the radio receiving circuit 413, 423, 433) by using a predetermined radio communication method.

Thus, in the third embodiment, the signal transmitting unit 44 (the radio transmitting circuit 44B) can output (transmit) a signal relating to the distortion of the load current to the active filters 41 to 43 by using radio communication. Therefore, the influence of the variation of the reference potential of the active filters 41 to 43 on the transmitted signal (the signal relating to the distortion of the load current) can be reduced. The reference potentials of the active filters 41 to 43 are not connected to each other on the transmitting side, and, therefore, a situation in which a current flows between the active filters 41 to 43 due to variations in each reference potential can be prevented. Therefore, the influence on the operation of the active filters 41 to 43 due to the variation of the reference potential of each of the active filters 41 to 43 can be reduced.

Fourth Embodiment

Next, a fourth embodiment will be described with reference to FIG. 4. Hereafter, the explanation will be mainly on the different parts from the first embodiment, etc., and the explanation about the same or corresponding content as the first embodiment, etc., may be simplified or omitted.

Figure 4:
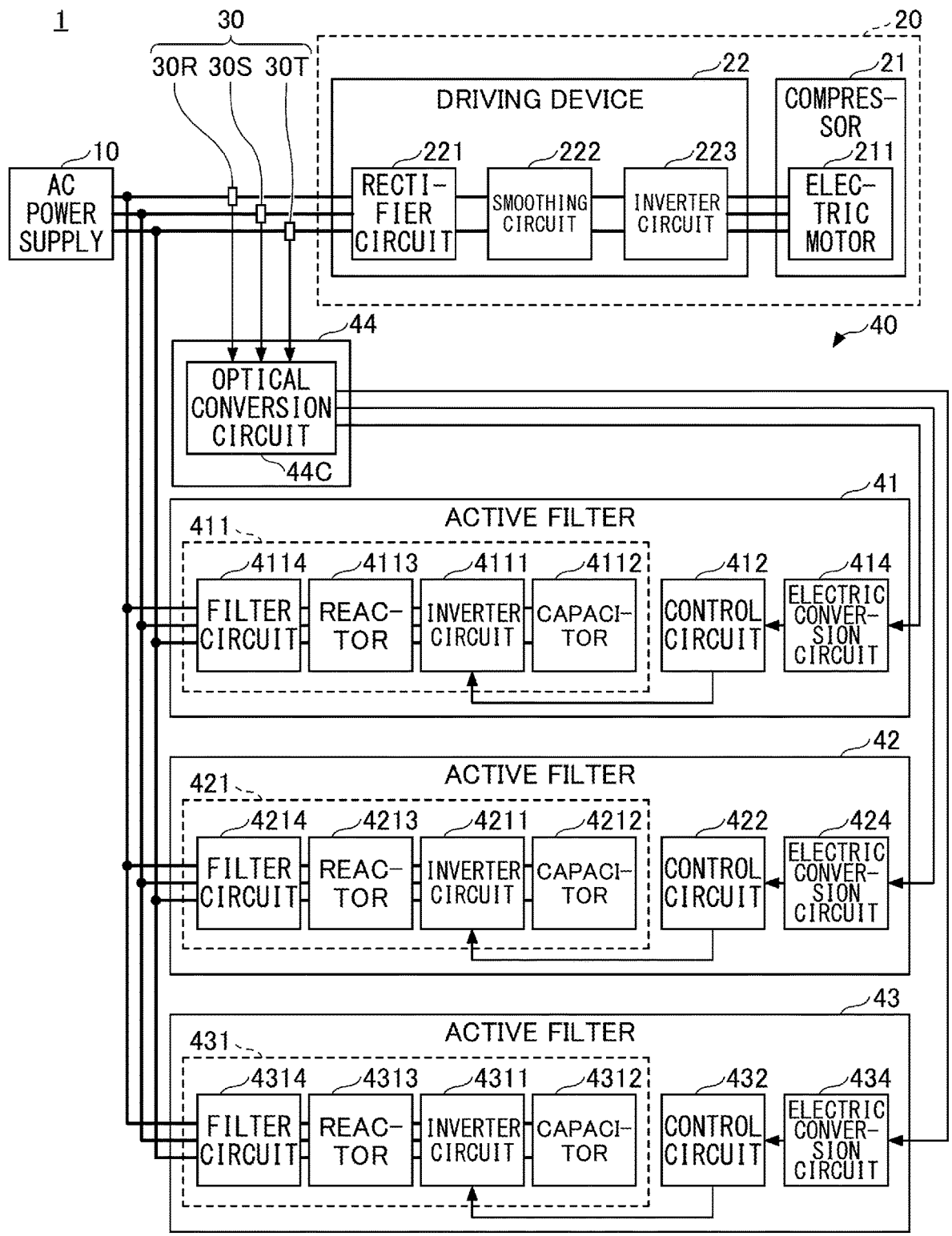
FIG. 4 is a diagram illustrating an example of the driving system according to the fourth embodiment.

FIG. 4 is a diagram illustrating an example of the driving system 1 according to the fourth embodiment.

As illustrated in FIG. 4, the driving system 1 according to the fourth embodiment includes the AC power supply 10, the load device 20, the load current sensor 30, and the current distortion reduction apparatus 40, as in the first embodiment.

The current distortion reduction apparatus 40 includes a plurality (in this example, three) of active filters 41 to 43 and the signal transmitting unit 44 as in the first embodiment and the like.

The active filter 41 includes the current output circuit 411 and the control circuit 412 as in the first embodiment and the like. Further, the active filter 41 includes an electric conversion circuit 414.

The current output circuit 411 includes an inverter circuit 4111, a capacitor 4112, a reactor 4113, and a filter circuit 4114, as in the first embodiment.

The electric conversion circuit 414 converts the optical signal (a signal relating to the distortion of the load current) input from the signal transmitting unit 44 (an optical conversion circuit 44C) through an optical fiber into an electric signal and outputs the electric signal to the control circuit 412.

The active filter 42 includes the current output circuit 421 and the control circuit 422 as in the first embodiment and the like. Further, the active filter 42 includes an electric conversion circuit 424.

The current output circuit 421 includes the inverter circuit 4211, the capacitor 4212, the reactor 4213, and the filter circuit 4214, as in the first embodiment.

Similar to the electric conversion circuit 414, the electric conversion circuit 424 converts an optical signal (a signal relating to the distortion of the load current) input through an optical fiber from the signal transmitting unit 44 (the optical conversion circuit 44C) into an electric signal and outputs the electric signal to the control circuit 422.

The active filter 43 includes the current output circuit 431 and the control circuit 432 as in the first embodiment and the like. Further, the active filter 43 includes an electric conversion circuit 434.

The current output circuit 431 includes the inverter circuit 4311, the capacitor 4312, the reactor 4313, and the filter circuit 4314, as in the first embodiment.

Similar to the electric conversion circuit 414 and 424, the electric conversion circuit 434 converts an optical signal (a signal relating to the distortion of the load current) input from the signal transmitting unit 44 (the optical conversion circuit 44C) through an optical fiber into an electric signal and outputs the electric signal to the control circuit 432.

The signal transmitting unit 44 transmits a signal relating to the distortion of the load current to the active filters 41 to 43 (the control circuit 412, 422, 432) based on the input detection signal of the load current sensor 30 (the load current sensors 30S, 30R, and 30T) as in the first embodiment, etc.

The signal transmitting unit 44 includes the optical conversion circuit 44C.

The optical conversion circuit 44C converts the signal relating to the distortion of the load current into an optical signal and outputs (transmits) the optical signal through an optical fiber to each of the active filters 41 to 43.

Thus, in the fourth embodiment, the signal transmitting unit 44 (the optical conversion circuit 44C) can convert a signal relating to the distortion of the load current into an optical signal and output (transmit) the optical signal to the active filters 41 to 43. Therefore, the influence of the variation of the reference potential of the active filters 41 to 43 on the transmitted signal (the signal relating to the distortion of the load current) can be reduced. The reference potentials of the active filters 41 to 43 are not connected to each other on the transmitting side, and, therefore, a situation in which a current flows between the active filters 41 to 43 due to variations in each reference potential can be prevented. Therefore, the influence on the operation of the active filters 41 to 43 due to the variation of the reference potential of each of the active filters 41 to 43 can be reduced.

Fifth Embodiment

Next, a fifth embodiment will be described with reference to FIGS. 5 to 7. Hereafter, the explanation will be mainly on the different parts from the first embodiment, etc., and the explanation about the same or corresponding content as the first embodiment, etc., may be simplified or omitted.

Figure 5:
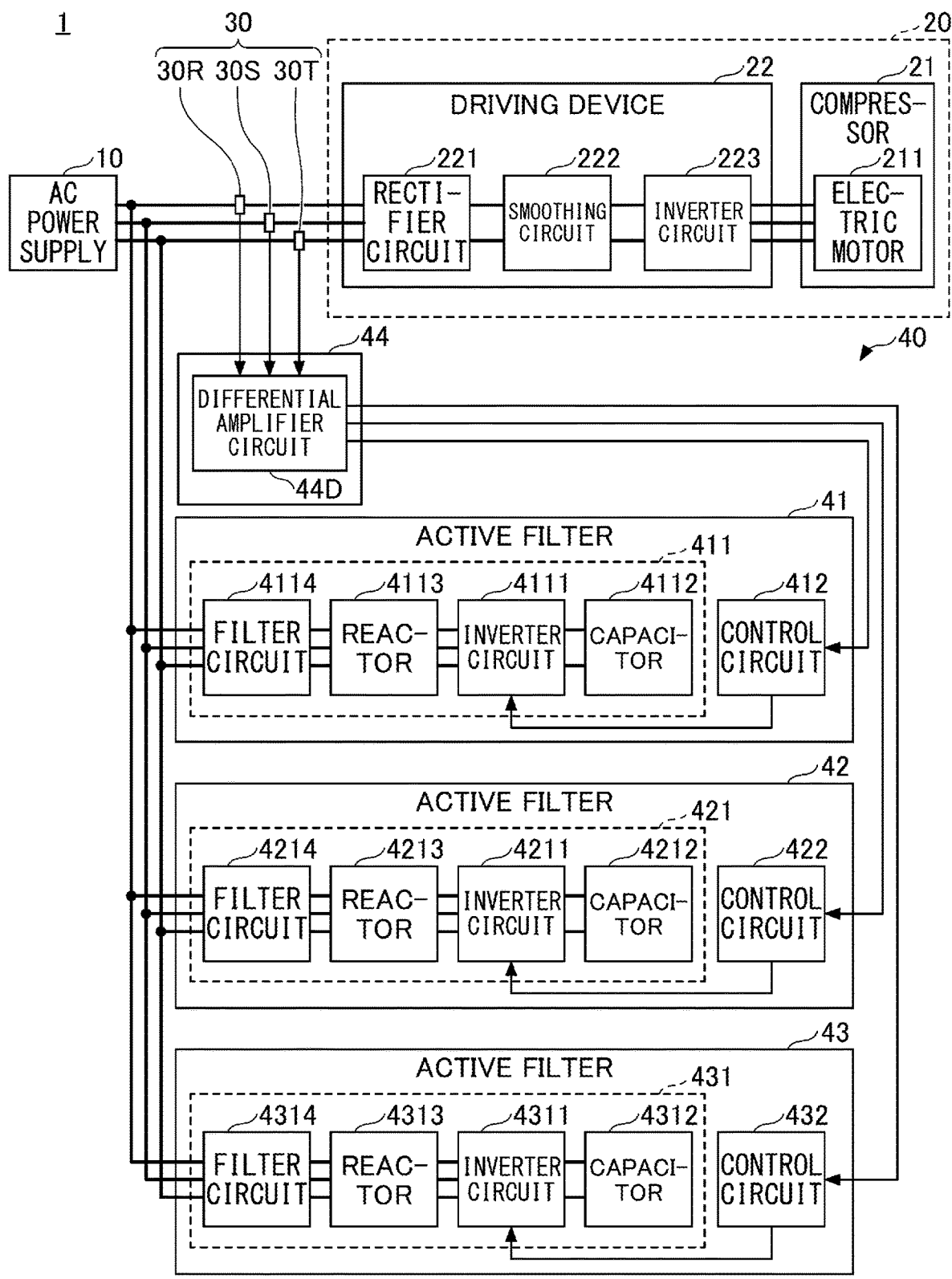
FIG. 5 is a diagram illustrating an example of a driving system according to the fifth embodiment.

FIG. 5 is a diagram illustrating an example of the driving system 1 according to the fifth embodiment.

As illustrated in FIG. 5, the driving system 1 according to the fifth embodiment includes the AC power supply 10, the load device 20, the load current sensor 30, and the current distortion reduction apparatus 40.

The current distortion reduction apparatus 40 includes a plurality (in this example, three) of the active filters 41 to 43 and the signal transmitting unit 44 as in the first embodiment and the like.

The active filter 41 includes the current output circuit 411 and the control circuit 412 as in the first embodiment and the like.

The current output circuit 411 includes an inverter circuit 4111, a capacitor 4112, a reactor 4113, and a filter circuit 4114, as in the first embodiment.

The active filter 42 includes the current output circuit 421 and the control circuit 422 as in the first embodiment and the like.

The current output circuit 421 includes the inverter circuit 4211, the capacitor 4212, the reactor 4213, and a filter circuit 4214, as in the first embodiment.

The active filter 43 includes the current output circuit 431 and the control circuit 432 as in the first embodiment and the like.

The current output circuit 431 includes the inverter circuit 4311, the capacitor 4312, the reactor 4313, and the filter circuit 4314, as in the first embodiment.

The signal transmitting unit 44 transmits a signal relating to the distortion of the load current to the active filters 41 to 43 (the control circuit 412, 422, 432) based on the input detection signal of the load current sensor 30 (the load current sensor 30R, 30S, 30T) as in the first embodiment, etc.

The signal transmitting unit 44 includes a differential amplifier circuit 44D.

The differential amplifier circuit 44D performs differential amplification on a voltage (signal) corresponding to a signal relating to the distortion of the load current, and outputs the voltage signal subjected to differential amplification (differential signal) to each of the multiple active filters 41 to 43.

Figure 6:
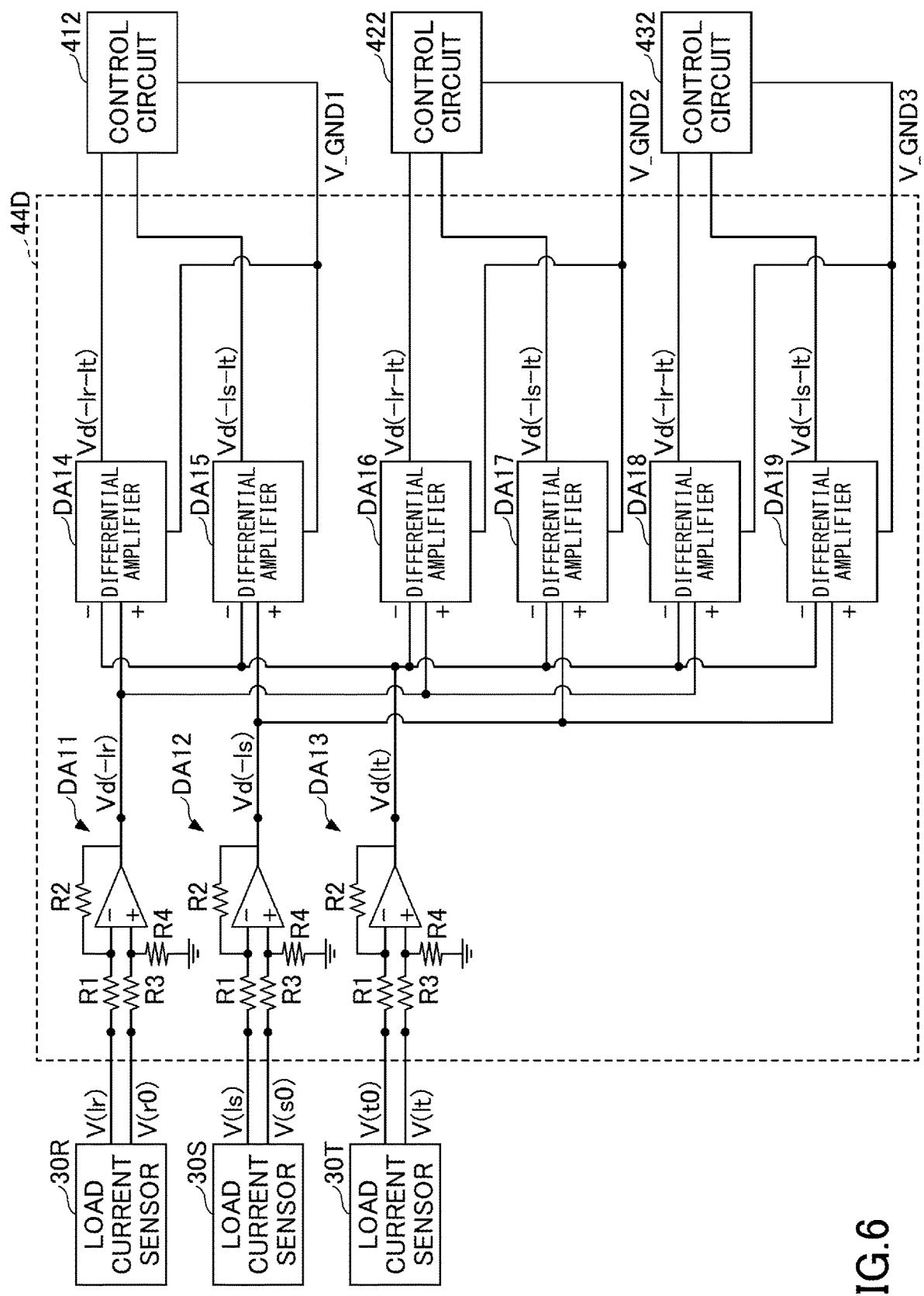
FIG. 6 is a circuit diagram illustrating an example of a differential amplifier circuit.

For example, FIG. 6 illustrates an example of the differential amplifier circuit 44D.

As illustrated in FIG. 6, the differential amplifier circuit 44D includes differential amplifiers DA11 to DA19.

In this example, the differential amplifiers DA11 to DA19 each have the same configuration.

Therefore, the detailed configuration of the differential amplifiers DA14 to DA19 is omitted in FIG. 6.

The differential amplifiers DA11 to DA19 include an operational amplifier and resistors R1 to R4, respectively. In this example, the resistors R1 and R3 are configured to have approximately equal resistance values, and the resistors R2 and R4 are configured to have approximately equal resistance values. "Approximately" means, for example, the intention to allow manufacturing errors.

The output voltage $V_{out}$ of each of the differential amplifiers DA11 to DA19 is expressed by the following equation (1), with respect to the positive input voltage $V_{IN+}$ and the negative input voltage $V_{IN-}$.

$$V_{out} = R2/R1 \cdot (V_{IN+} - V_{IN-}) \quad (1)$$

That is, each of the differential amplifiers DA11 to DA19 can output the output voltage $V_{out}$, which is obtained by amplifying, by the ratio of the resistor R1 to the resistor R2, the differential voltage between the positive input voltage $V_{IN+}$ and the negative input voltage $V_{IN-}$.

In the differential amplifier DA11, the reference potential V (r0) of the load current sensor 30R is input to the positive side thereof, and the voltage V (Ir) as the detection signal of the load current Ir of the R-phase line detected by the load current sensor 30R is input to the negative side thereof. Then, the differential amplifier DA11 outputs a voltage signal Vd (−Ir) obtained by amplifying (that is, by performing differential amplification on) the differential voltage between the reference potential V (r0) and the voltage V (Ir).

The differential voltage between the reference potential V (r0) and the voltage V (Ir) corresponds to the positive/negative inversion value (−Ir) of the detection signal of the load current Ir. Therefore, the voltage signal Vd (−Ir) represents the voltage corresponding to the positive/negative inversion value of the detection signal of the load current Ir.

In the differential voltage between the reference potential V (r0) and the voltage V (Ir) based on the reference potential V (r0), the in-phase noise (common-mode noise) due to the variation of the reference potential V (r0) is canceled out. Therefore, the differential amplifier DA11 can reduce the influence of the variation of the reference potential V (r0) of the load current sensor 30R on the output voltage signal Vd (−Ir). Furthermore, when the resistance value of the resistor R2 is larger than the resistance value of the resistor R1, the differential amplifier DA11 can reduce the influence of other noise on the output voltage signal Vd (−Ir) by amplifying the differential voltage between the reference potential V (r0) and the voltage V (Ir).

In the differential amplifier DA12, the reference potential V (s0) of the load current sensor 30S is input to the positive side thereof, and the voltage V (Is) as a detection signal of the load current Is of the S-phase line detected by the load current sensor 30S is input to the negative side thereof. Then, the differential amplifier DA12 outputs a voltage signal Vd (−Is) obtained by amplifying (that is, by performing differential amplification on) the differential voltage between the reference potential V (s0) and the voltage V (Is).

The differential voltage between the reference potential V (s0) and the voltage V (Is) corresponds to the positive/negative inversion value (−Is) of the detection signal of the load current Is. Therefore, the voltage signal Vd (−Is) represents the voltage corresponding to the positive/negative inversion value of the detection signal of the load current Is.

In the differential voltage between the reference potential V (s0) and the voltage V (Is) based on the reference potential V (s0), the in-phase noise (common-mode noise) due to the variation of the reference potential V (s0) is canceled out. Therefore, the differential amplifier DA12 can reduce the influence of the variation of the reference potential V (s0) of the load current sensor 30S on the output voltage signal Vd (−Is). Furthermore, when the resistance value of the resistor R2 is larger than the resistance value of the resistor R1, the differential amplifier DA12 can reduce the influence of other noise on the output voltage signal Vd (−Is) by amplifying the differential voltage between the reference potential V (s0) and the voltage V (Is).

In the differential amplifier DA13, the voltage V (It) as a detection signal of the load current It of the T-phase line detected by the load current sensor 30T is input to the positive side thereof, and the reference potential V (t0) of the load current sensor 30T is input to the negative side thereof. Then, the differential amplifier DA13 outputs a voltage signal Vd (It) obtained by amplifying (that is, by performing differential amplification on) the differential voltage between the voltage V (It) and the reference potential V (t0).

The differential voltage between the voltage V (It) and the reference potential V (t0) corresponds to the detection signal of the load current It. Therefore, the voltage signal Vd (It) represents the voltage corresponding to the detection signal of the load current It.

Further, the in-phase noise (common-mode noise) due to the variation of the reference potential V (t0) is canceled out by the differential voltage between the voltage V (It) based on the reference potential V (t0) and the reference potential V (t0). Therefore, the differential amplifier DA13 can reduce the influence of the variation of the reference potential V (t0) of the load current sensor 30T on the output voltage signal Vd (It). Furthermore, when the resistance value of the resistor R2 is larger than the resistance value of the resistor R1, the differential amplifier DA13 can reduce the influence of other noise on the output voltage signal Vd (It) by amplifying the differential voltage between the voltage V (It) and the reference potential V (t0).

The differential amplifier DA14 is connected to the control circuit 412 at the output side, and the reference potential thereof is connected to the reference potential V_GND1 of the active filter 41 (the control circuit 412). In the differential amplifier DA14, the voltage signal Vd (−Ir) is input to the positive side thereof and the voltage signal Vd (It) is input to the negative side thereof. Then, the differential amplifier DA14 outputs, to the control circuit 412, the voltage signal Vd (−Ir−It), which is obtained by amplifying (that is, by performing differential amplification on) the differential voltage between the voltage signal Vd (−Ir) and the voltage signal Vd (It), based on the reference potential V_GND1.

The differential voltage between the voltage signal Vd (−Ir) and the voltage signal Vd (It) corresponds to the positive/negative inversion value (−Ir−It) of the sum of the detection signal of the load current Ir and the detection signal of the load current It. Therefore, the voltage signal Vd (−Ir−It) represents the voltage corresponding to the positive/negative inversion value of the sum of the detection signal of the load current Ir and the detection signal of the load current It. Therefore, the control circuit 412 can acquire a signal representing the sum of the load current Ir and the load current It as a signal relating to the distortion of the load current.

The differential voltage of the input voltage signals Vd (−Ir) and Vd (It) is amplified based on the reference potential V_GND1 of the active filter 41. Therefore, the in-phase noise (common-mode noise) due to the variation of the reference potential V_GND1 is canceled out. Therefore, the differential amplifier DA14 can reduce the influence of the variation of the reference potential V_GND1 of the active filter 41 on the output voltage signal Vd (−Ir−It). Furthermore, when the resistance value of the resistor R2 is larger than the resistance value of the resistor R1, the differential amplifier DA14 can reduce the influence of other noise on the output voltage signal Vd (−Ir−It) by amplifying the differential voltage between the voltage signal Vd (−Ir) and the voltage signal Vd (It).

The differential amplifier DA15 is connected to the control circuit 412 at the output side, and the reference potential thereof is connected to the reference potential V_GND1 of the active filter 41 (the control circuit 412). In the differential amplifier DA15, the voltage signal Vd (−Is) is input to the positive side thereof and the voltage signal Vd (It) is input to the negative side thereof. Then, the differential amplifier DA15 outputs a voltage signal Vd (−Is−It), which is obtained by amplifying (that is, by performing differential amplification on) the differential voltage between the voltage signal Vd (−Is) and the voltage signal Vd (It), to the control circuit 412, based on the reference potential V_GND1.

The differential voltage between the voltage signal Vd (−Is) and the voltage signal Vd (It) corresponds to the positive/negative inversion value (−Is−It) of the sum of the detection signal of the load current Is and the detection signal of the load current It. Therefore, the voltage signal Vd (−Is−It) represents the voltage corresponding to the positive/negative inversion value of the sum of the detection signal of the load current Is and the detection signal of the load current It. Therefore, the control circuit 412 can acquire a signal representing the sum of the load current Is and the load current It as a signal relating to the distortion of the load current.

The differential voltage of the input voltage signals Vd (−Is) and Vd (It) is amplified based on the reference potential V_GND1 of the active filter 41. Therefore, the in-phase noise (common-mode noise) due to the variation of the reference potential V_GND1 is canceled out. Therefore, the differential amplifier DA15 can reduce the influence of the variation of the reference potential V_GND1 of the active filter 41 on the output voltage signal Vd (−Is−It). Furthermore, when the resistance value of the resistor R2 is larger than the resistance value of the resistor R1, the differential amplifier DA15 can reduce the influence of other noise on the output voltage signal Vd (−Is−It) by amplifying the differential voltage between the voltage signal Vd (−Is) and the voltage signal Vd (It).

The differential amplifier DA16 is connected to the control circuit 422 at the output side, and the reference potential thereof is connected to the reference potential V_GND2 of the active filter 42 (the control circuit 422). In the differential amplifier DA16, the voltage signal Vd (−Ir) is input to the positive side thereof and the voltage signal Vd (It) is input to the negative side thereof. Then, the differential amplifier DA16 outputs, to the control circuit 422, a voltage signal Vd (−Ir−It) obtained by amplifying (that is, by performing differential amplification on) the differential voltage between the voltage signal Vd (−Ir) and the voltage signal Vd (It) based on the reference potential V_GND2.

The differential voltage between the voltage signal Vd (−Ir) and the voltage signal Vd (It) corresponds to the positive/negative inversion value (−Ir−It) of the sum of the detection signal of the load current Ir and the detection signal of the load current It. Therefore, the voltage signal Vd (−Ir−It) represents the voltage corresponding to the positive/negative inversion value of the sum of the detection signal of the load current Ir and the detection signal of the load current It. Therefore, the control circuit 422 can acquire a signal representing the sum of the load current Ir and the load current It as a signal relating to the distortion of the load current.

The differential voltage of the input voltage signals Vd (−Ir) and Vd (It) is amplified based on the reference potential V_GND2 of the active filter 42. Therefore, the in-phase noise (common-mode noise) due to the variation of the reference potential V_GND2 is canceled out. Therefore, the differential amplifier DA16 can reduce the influence of the variation of the reference potential V_GND2 of the active filter 42 on the output voltage signal Vd (−Ir−It). Furthermore, when the resistance value of the resistor R2 is larger than the resistance value of the resistor R1, the differential amplifier DA16 can reduce the influence of other noise on the output voltage signal Vd (−Ir−It) by amplifying the differential voltage between the voltage signal Vd (−Ir) and the voltage signal Vd (It).

The differential amplifier DA17 is connected to the control circuit 422 at the output side, and the reference potential thereof is connected to the reference potential V_GND2 of the active filter 42 (the control circuit 422). In the differential amplifier DA17, the voltage signal Vd (−Is) is input to the positive side thereof and the voltage signal Vd (It) is input to the negative side thereof. Then, the differential amplifier DA17 outputs, to the control circuit 422, a voltage signal Vd (−Is−It) obtained by amplifying (that is, by performing differential amplification on) the differential voltage between the voltage signal Vd (−Is) and the voltage signal Vd (It) based on the reference potential V_GND2.

The differential voltage between the voltage signal Vd (−Is) and the voltage signal Vd (It) corresponds to the positive/negative inversion value (−Is−It) of the sum of the detection signal of the load current Is and the detection signal of the load current It. Therefore, the voltage signal Vd (−Is−It) represents the voltage corresponding to the positive/negative inversion value of the sum of the detection signal of the load current Is and the detection signal of the load current It. Therefore, the control circuit 422 can acquire a signal representing the sum of the load current Is and the load current It as a signal relating to the distortion of the load current.

The differential voltage of the input voltage signals Vd (−Is) and Vd (It) is amplified based on the reference potential V_GND2 of the active filter 42. Therefore, the in-phase noise (common-mode noise) due to the variation of the reference potential V_GND2 is canceled out. Therefore, the differential amplifier DA17 can reduce the influence of the variation of the reference potential V_GND2 of the active filter 42 on the output voltage signal Vd (−Is−It). Furthermore, when the resistance value of the resistor R2 is larger than the resistance value of the resistor R1, the differential amplifier DA17 can reduce the influence of other noise on the output voltage signal Vd (−Is−It) by amplifying the differential voltage between the voltage signal Vd (−Is) and the voltage signal Vd (It).

The differential amplifier DA18 is connected to the control circuit 432 at the output side, and the reference potential thereof is connected to the reference potential V_GND3 of the active filter 43 (the control circuit 432). In the differential amplifier DA18, the voltage signal Vd (−Ir) is input to the positive side thereof and the voltage signal Vd (It) is input to the negative side thereof. Then, the differential amplifier DA18 outputs, to the control circuit 432, a voltage signal Vd (−Ir−It) obtained by amplifying (that is, by performing differential amplification on) the differential voltage between the voltage signal Vd (−Ir) and the voltage signal Vd (It) based on the reference potential V_GND3.

The differential voltage between the voltage signal Vd (−Ir) and the voltage signal Vd (It) corresponds to the positive/negative inversion value (−Ir−It) of the sum of the detection signal of the load current Ir and the detection signal of the load current It. Therefore, the voltage signal Vd (−Ir−It) represents the voltage corresponding to the positive/negative inversion value of the sum of the detection signal of the load current Ir and the detection signal of the load current It. Therefore, the control circuit 432 can acquire a signal representing the sum of the load current Ir and the load current It as a signal relating to the distortion of the load current.

The differential voltage of the input voltage signals Vd (−Ir) and Vd (It) is amplified based on the reference potential V_GND3 of the active filter 43. Therefore, the in-phase noise (common-mode noise) due to the variation of the reference potential V_GND3 is canceled out. Therefore, the differential amplifier DA18 can reduce the influence of the variation of the reference potential V_GND3 of the active filter 43 on the output voltage signal Vd (−Ir−It). Furthermore, when the resistance value of the resistor R2 is larger than the resistance value of the resistor R1, the differential amplifier DA18 can reduce the influence of other noise on the output voltage signal Vd (−Ir−It) by amplifying the differential voltage between the voltage signal Vd (−Ir) and the voltage signal Vd (It).

The differential amplifier DA19 is connected to the control circuit 432 at the output side, and the reference potential thereof is connected to the reference potential V_GND3 of the active filter 43 (the control circuit 432). In the differential amplifier DA19, the voltage signal Vd (−Is) is input to the positive side thereof and the voltage signal Vd (It) is input to the negative side thereof. Then, the differential amplifier DA19 outputs, to the control circuit 432, the voltage signal Vd (−Is−It), which is obtained by amplifying (that is, by performing differential amplification on) the differential voltage between the voltage signal Vd (−Is) and the voltage signal Vd (It) based on the reference potential V_GND3.

The differential voltage between the voltage signal Vd (−Is) and the voltage signal Vd (It) corresponds to the positive/negative inversion value (−Is−It) of the sum of the detection signal of the load current Is and the detection signal of the load current It. Therefore, the voltage signal Vd (−Is−It) represents the voltage corresponding to the positive/negative inversion value of the sum of the detection signal of the load current Is and the detection signal of the load current It. Therefore, the control circuit 432 can acquire a signal representing the sum of the load current Is and the load current It as a signal relating to the distortion of the load current.

The differential voltage of the input voltage signals Vd (−Is) and Vd (It) is amplified based on the reference potential V_GND3 of the active filter 43. Therefore, the in-phase noise (common-mode noise) due to the variation of the reference potential V_GND3 is canceled out. Therefore, the differential amplifier DA19 can reduce the influence of the variation of the reference potential V_GND3 of the active filter 43 on the output voltage signal Vd (−Is−It). Furthermore, when the resistance value of the resistor R2 is larger than the resistance value of the resistor R1, the differential amplifier DA19 can reduce the influence of other noise on the output voltage signal Vd (−Is−It) by amplifying the differential voltage between the voltage signal Vd (−Is) and the voltage signal Vd (It).

In this example (FIG. 6), the differential amplifier DA11 may be replaced by another circuit capable of outputting a voltage signal corresponding to the detection signal of the load current sensor 30R (the detection signal of the load current Ir) without depending on differential amplification. Further, the differential amplifier DA11 may be omitted and the voltage V (Ir) as the detection signal of the load current sensor 30R may be input to the differential amplifiers DA14, DA16 and DA18. Similarly, the differential amplifier DA12 may be replaced by another circuit capable of outputting a voltage signal corresponding to the detection signal of the load current sensor 30S (the detection signal of the load current Is), without depending on differential amplification. Further, the differential amplifier DA12 may be omitted and the voltage V (Is) as the detection signal of the load current sensor 30S may be input to the differential amplifiers DA15, DA17, and DA19. Similarly, the differential amplifier DA13 may be replaced by another circuit capable of outputting a voltage signal corresponding to the detection signal of the load current sensor 30T (the detection signal of the load current It), without depending on differential amplification. Further, the differential amplifier DA13 may be omitted and the voltage V (It) as the detection signal of the load current sensor 30T may be input to the differential amplifiers DA14 to DA19.

Figure 7:
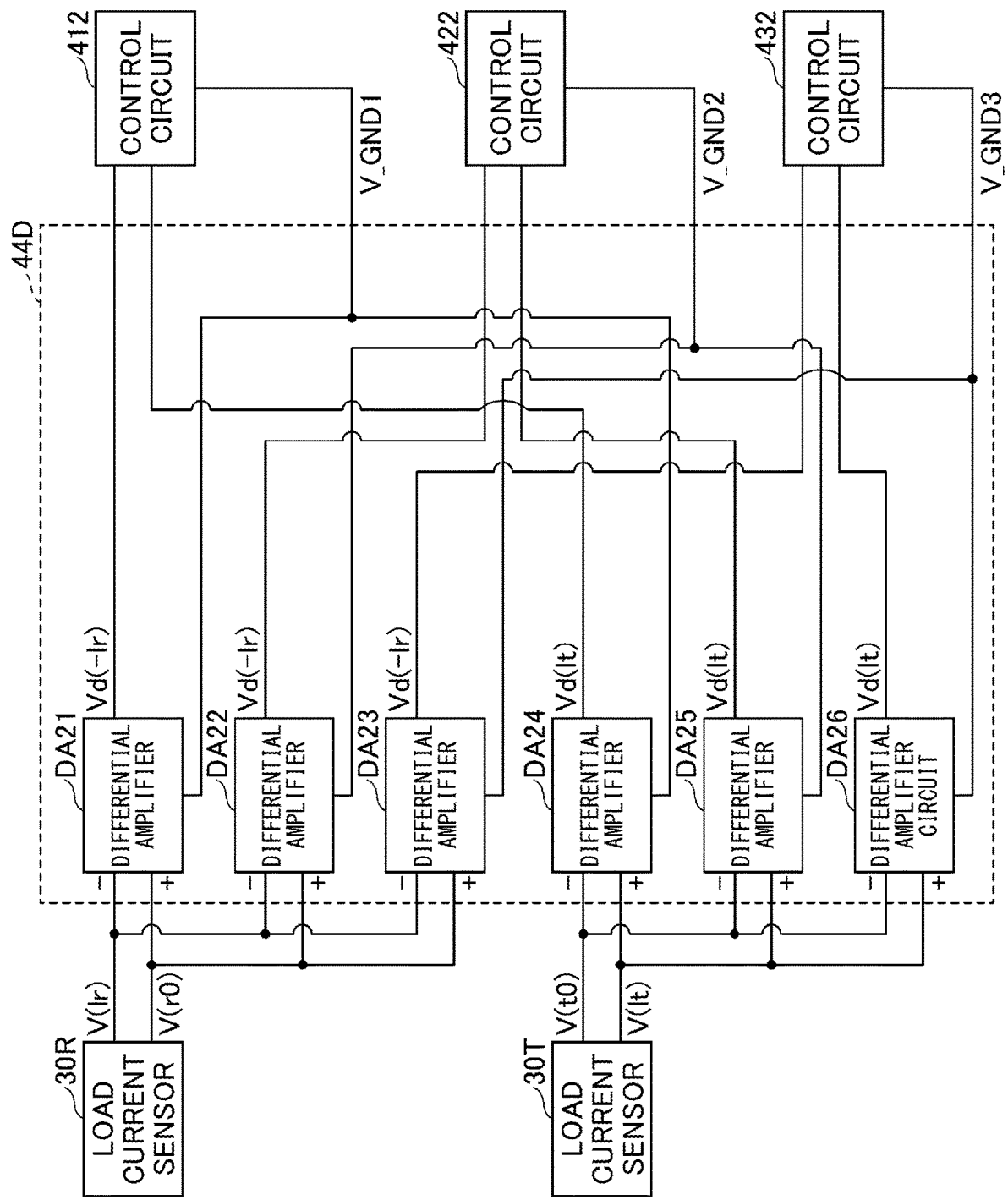
FIG. 7 is a circuit diagram illustrating another example of a differential amplifier circuit.

For example, FIG. 7 illustrates another example of the differential amplifier circuit 44D.

As illustrated in FIG. 7, the differential amplifier circuit 44D includes differential amplifiers DA21 to DA26.

In this example, the differential amplifiers DA21 to DA26 have the same configuration. The differential amplifiers DA21 to DA26 may have the same configuration as the differential amplifiers DA11 to DA19 in FIG. 6, respectively. Therefore, the detailed configuration of the differential amplifiers DA21 to DA26 is omitted in FIG. 7.

The differential amplifier DA21 is connected to the control circuit 412 at the output side, and the reference potential thereof is connected to the reference potential V_GND1 of the active filter 41 (the control circuit 412). In the differential amplifier DA21, the reference potential V (r0) of the load current sensor 30R is input to the positive side thereof, and the voltage V (Ir) as the detection signal of the load current Ir of the R-phase line detected by the load current sensor 30R is input to the negative side thereof. Then, the differential amplifier DA21 outputs, to the control circuit 412, a voltage signal Vd (−Ir) obtained by amplifying (that is, by performing differential amplification on) the differential voltage between the reference potential V (r0) and the voltage V (Ir) based on the reference potential V_GND1.

The voltage signal Vd (−Ir) corresponds to the positive/negative inversion value of the detection signal of the load current Ir as described above. Therefore, the control circuit 412 can acquire a signal representing the load current Ir as a signal relating to the distortion of the load current.

In the differential voltage between the reference potential V (r0) and the voltage V (Ir) based on the reference potential V (r0), the in-phase noise (common-mode noise) due to the variation of the reference potential V (r0) is canceled out. Therefore, the differential amplifier DA21 can reduce the influence of the variation of the reference potential V (r0) of the load current sensor 30R on the output voltage signal Vd (−Ir).

The differential voltage of the input reference potential V (r0) and the voltage V (Ir) is amplified based on the reference potential V_GND1 of the active filter 41. Therefore, the in-phase noise (common-mode noise) due to the variation of the reference potential V_GND1 is canceled out. Therefore, the differential amplifier DA21 can reduce the influence of the variation of the reference potential V_GND1 of the active filter 41 on the output voltage signal Vd (−Ir). Furthermore, when the resistance value of the resistor R2 is larger than the resistance value of the resistor R1, the differential amplifier DA21 can reduce the influence of other noise on the output voltage signal Vd (−Ir) by amplifying the differential voltage between the reference potential V (r0) and the voltage V (Ir).

The differential amplifier DA22 is connected to the control circuit 422 at the output side, and the reference potential thereof is connected to the reference potential V_GND2 of the active filter 42 (the control circuit 422). In the differential amplifier DA22, the reference potential V (r0) of the load current sensor 30R is input to the positive side thereof, and the voltage V (Ir) as the detection signal of the load current Ir of the R-phase line detected by the load current sensor 30R is input to the negative side thereof. Then, the differential amplifier DA22 outputs, to the control circuit 422, a voltage signal Vd (−Ir) obtained by amplifying (that is, by performing differential amplification on) the differential voltage between the reference potential V (r0) and the voltage V (Ir) based on the reference potential V_GND2.

The voltage signal Vd (−Ir) corresponds to the positive/negative inversion value of the detection signal of the load current Ir as described above. Therefore, the control circuit 422 can acquire a signal representing the load current Ir as a signal relating to the distortion of the load current.

In the differential voltage between the reference potential V (r0) and the voltage V (Ir) based on the reference potential V (r0), the in-phase noise (common-mode noise) due to the variation of the reference potential V (r0) is canceled out. Therefore, the differential amplifier DA22 can reduce the influence of the variation of the reference potential V (r0) of the load current sensor 30R on the output voltage signal Vd (−Ir).

The differential voltage of the input reference potential V (r0) and the voltage V (Ir) is amplified based on the reference potential V_GND2 of the active filter 42. Therefore, the in-phase noise (common-mode noise) due to the variation of the reference potential V_GND2 is canceled out. Therefore, the differential amplifier DA22 can reduce the influence of the variation of the reference potential V_GND2 of the active filter 42 on the output voltage signal Vd (−Ir). Furthermore, when the resistance value of the resistor R2 is larger than the resistance value of the resistor R1, the differential amplifier DA22 can reduce the influence of other noise on the output voltage signal Vd (−Ir) by amplifying the differential voltage between the reference potential V (r0) and the voltage V (Ir).

The differential amplifier DA23 is connected to the control circuit 432 at the output side, and the reference potential thereof is connected to the reference potential V_GND3 of the active filter 43 (the control circuit 432). In the differential amplifier DA23, the reference potential V (r0) of the load current sensor 30R is input to the positive side, and the voltage V (Ir) as the detection signal of the load current Ir of the R-phase line detected by the load current sensor 30R is input to the negative side. Then, the differential amplifier DA23 outputs, to the control circuit 432, a voltage signal Vd (−Ir) obtained by amplifying (that is, by performing differential amplification on) the differential voltage between the reference potential V (r0) and the voltage V (Ir) based on the reference potential V_GND3.

The voltage signal Vd (−Ir) corresponds to the positive/negative inversion value of the detection signal of the load current Ir as described above. Therefore, the control circuit 432 can acquire a signal representing the load current Ir as a signal relating to the distortion of the load current.

In the differential voltage between the reference potential V (r0) and the voltage V (Ir) based on the reference potential V (r0), the in-phase noise (common-mode noise) due to the variation of the reference potential V (r0) is canceled out. Therefore, the differential amplifier DA23 can reduce the influence of the variation of the reference potential V (r0) of the load current sensor 30R on the output voltage signal Vd (−Ir).

The differential voltage of the input reference potential V (r0) and voltage V (Ir) is amplified based on the reference potential V_GND3 of the active filter 43. Therefore, the in-phase noise (common-mode noise) due to the variation of the reference potential V_GND3 is canceled out. Therefore, the differential amplifier DA23 can reduce the influence of the variation of the reference potential V_GND3 of the active filter 43 on the output voltage signal Vd (−Ir). Furthermore, when the resistance value of the resistor R2 is larger than the resistance value of the resistor R1, the differential amplifier DA23 can reduce the influence of other noise on the output voltage signal Vd (−Ir) by amplifying the differential voltage between the reference potential V (r0) and the voltage V (Ir).

The differential amplifier DA24 is connected to the control circuit 412 at the output side, and the reference potential thereof is connected to the reference potential V_GND1 of the active filter 41 (the control circuit 412). In the differential amplifier DA24, the reference potential V (t0) of the load current sensor 30T is input to the negative side thereof, and the voltage V (It) as a detection signal of the load current It of the T-phase line detected by the load current sensor 30T is input to the positive side thereof. Then, the differential amplifier DA24 outputs, to the control circuit 412, a voltage signal Vd (It) obtained by amplifying (that is, by performing differential amplification on) the differential voltage between the voltage V (It) and the reference potential V (t0) based on the reference potential V_GND1.

The voltage signal Vd (It) corresponds to the detection signal of the load current It, as described above. Therefore, the control circuit 412 can acquire a signal representing the load current It as a signal relating to the distortion of the load current.

Further, the in-phase noise (common-mode noise) due to the variation of the reference potential V (t0) is canceled out by the differential voltage between the voltage V (It) based on the reference potential V (t0) and the reference potential V (t0). Therefore, the differential amplifier DA24 can reduce the influence of the variation of the reference potential V (t0) of the load current sensor 30T on the output voltage signal Vd (It).

Further, the differential voltage of the input voltage V (It) and the reference potential V (t0) is amplified based on the reference potential V_GND1 of the active filter 41. Therefore, the in-phase noise (common-mode noise) due to the variation of the reference potential V_GND1 is canceled out. Therefore, the differential amplifier DA24 can reduce the influence of the variation of the reference potential V_GND1 of the active filter 41 on the output voltage signal Vd (It). Furthermore, when the resistance value of the resistor R2 is larger than the resistance value of the resistor R1, the differential amplifier DA24 can reduce the influence of other noise on the output voltage signal Vd (It) by amplifying the differential voltage between the voltage V (It) and the reference potential V (t0).

The differential amplifier DA25 is connected to the control circuit 422 at the output side, and the reference potential thereof is connected to the reference potential V_GND2 of the active filter 42 (the control circuit 422). In the differential amplifier DA25, the reference potential V (t0) of the load current sensor 30T is input to the negative side thereof, and the voltage V (It) as a detection signal of the load current It of the T-phase line detected by the load current sensor 30T is input to the positive side thereof. Then, the differential amplifier DA25 outputs, to the control circuit 422, a voltage signal Vd (It) obtained by amplifying (that is, by performing differential amplification on) the differential voltage between the voltage V (It) and the reference potential V (t0) based on the reference potential V_GND2.

The voltage signal Vd (It) corresponds to the detection signal of the load current It, as described above. Therefore, the control circuit 422 can acquire a signal representing the load current It as a signal relating to the distortion of the load current.

Further, the in-phase noise (common-mode noise) due to the variation of the reference potential V (t0) is canceled out by the differential voltage between the voltage V (It) based on the reference potential V (t0) and the reference potential V (t0). Therefore, the differential amplifier DA25 can reduce the influence of the variation of the reference potential V (t0) of the load current sensor 30T on the output voltage signal Vd (It).

Further, the differential voltage of the input voltage V (It) and the reference potential V (t0) is amplified based on the reference potential V_GND2 of the active filter 42. Therefore, the in-phase noise (common-mode noise) due to the variation of the reference potential V_GND2 is canceled out. Therefore, the differential amplifier DA25 can reduce the influence of the variation of the reference potential V_GND2 of the active filter 42 on the output voltage signal Vd (It). Furthermore, when the resistance value of the resistor R2 is larger than the resistance value of the resistor R1, the differential amplifier DA25 can reduce the influence of other noise on the output voltage signal Vd (It) by amplifying the differential voltage between the voltage V (It) and the reference potential V (t0).

The differential amplifier DA26 is connected to the control circuit 432 at the output side, and the reference potential thereof is connected to the reference potential V_GND3 of the active filter 43 (the control circuit 432). In the differential amplifier DA26, the reference potential V (t0) of the load current sensor 30T is input to the negative side thereof, and the voltage V (It) as a detection signal of the load current It of the T-phase line detected by the load current sensor 30T is input to the positive side thereof. Then, the differential amplifier DA26 outputs, to the control circuit 432, a voltage signal Vd (It) obtained by amplifying (that is, by performing differential amplification on) the differential voltage between the voltage V (It) and the reference potential V (t0) based on the reference potential V_GND3.

The voltage signal Vd (It) corresponds to the detection signal of the load current It, as described above. Therefore, the control circuit 432 can acquire a signal representing the load current It as a signal relating to the distortion of the load current.

Further, the in-phase noise (common-mode noise) due to the variation of the reference potential V (t0) is canceled out by the differential voltage between the voltage V (It) based on the reference potential V (t0) and the reference potential V (t0). Therefore, the differential amplifier DA26 can reduce the influence of the variation of the reference potential V (t0) of the load current sensor 30T on the output voltage signal Vd (It).

The differential voltage of the input voltage V (It) and the reference potential V (t0) is amplified based on the reference potential V_GND3 of the active filter 43. Therefore, the in-phase noise (common-mode noise) due to the variation of the reference potential V_GND3 is canceled out. Therefore, the differential amplifier DA26 can reduce the influence of the variation of the reference potential V_GND3 of the active filter 43 on the output voltage signal Vd (It). Furthermore, when the resistance value of the resistor R2 is larger than the resistance value of the resistor R1, the differential amplifier DA26 can reduce the influence of other noise on the output voltage signal Vd (It) by amplifying the differential voltage between the voltage V (It) and the reference potential V (t0).

The differential amplifier circuit 44D may be configured to include an instrumentation amplifier.

Thus, in the fifth embodiment, the signal transmitting unit 44 (the differential amplifier circuit 44D) can perform differential amplification on the voltage corresponding to the signal relating to the distortion of the load current and cause the active filters 41 to 43 to acquire the voltage. Therefore, the influence of the variation of the reference potential of the active filters 41 to 43 on the transmitted signal (the signal relating to the distortion of the load current) can be reduced. Therefore, the influence on the operation of the active filters 41 to 43 due to the variation of the reference potential of each of the active filters 41 to 43 can be reduced.

Other Embodiments

Other embodiments will be described next.

The above first to fifth embodiment may be combined as appropriate or modified or changed as appropriate.

For example, the functions of the control circuit 412, 422, 432 and the signal transmitting unit 45 of the second embodiment may be applied to the third to fifth embodiments. That is, in the third to fifth embodiments, as in the second embodiment, a signal relating to the operation status of each of the active filters 41 to 43 may be transmitted to the driving device 22.

Further, for example, in the third embodiment, the additional signal transmitting unit 45 may be configured to enable radio communication with each of the active filters 41 to 43, similar to the signal transmitting unit 44. Thus, the signal transmitting unit 45 can receive signals relating to the operation status from each of the active filters 41 to 43 by using radio communication and transmit the signals to the driving device 22. Therefore, the influence of the variation of the reference potential of the active filters 41 to 43 on the transmitted signal (the signal relating to the operation status) can be reduced. Further, the reference potentials of the active filters 41 to 43 are not connected to each other on the receiving side of the signal, and, therefore, a situation in which a current flows between the active filters 41 to 43 due to variations in each reference potential can be prevented.

Further, for example, in the fourth embodiment, the additional signal transmitting unit 45 may be configured to enable optical communication through an optical fiber with each of the active filters 41 to 43, similar to the signal transmitting unit 44. Thus, the signal transmitting unit 45 can receive signals (optical signals) relating to the operation status from each of the active filters 41 to 43 through the optical fiber, convert the signals into electrical signals, and transmit the signals to the driving device 22. Therefore, the influence of the variation of the reference potential of the active filters 41 to 43 on the transmitted signal (signal relating to the operation status) can be reduced. Further, the reference potentials of the active filters 41 to 43 are not connected to each other on the receiving side of the signal, and, therefore, a situation in which a current flows between the active filters 41 to 43 due to variations in each reference potential can be prevented.

Further, for example, in the fifth embodiment, the additional signal transmitting unit 45 may have a configuration similar to the signal transmitting unit 44 in that the additional signal transmitting unit 45 performs differential amplification on a voltage corresponding to an input signal relating to the operation status, and outputs the voltage to the driving device 22. In this way, the signal transmitting unit 45 can reduce the influence of the variation of the reference potential of the active filters 41 to 43 on the transmitted signal (signal relating to the operation status).

[Functions]

Next, the functions of the current distortion reduction apparatus 40 according to the present embodiment will be described.

In the present embodiment, the multiple active filters 41 to 43 respectively reduce the distortion of the load current based on the detection signal relating to the distortion of the load current supplied from the AC power supply 10 to the load device 20, which is output from the load current sensor 30. Then, based on the detection signal output from the load current sensor 30, the signal transmitting unit 44 causes the multiple active filters 41 to 43 to acquire a signal relating to the distortion of the load current so as to reduce the influence of the fluctuation of the reference potential of the multiple active filters 41 to 43 on the operations thereof.

For example, the signal transmitting unit 44 may electrically insulate the signal relating to the distortion of the load current based on the detection signal relating to the distortion of the load current, and cause the multiple active filters 41 to 43 to acquire the signal (see first and second embodiment).

Further, for example, the signal transmitting unit 44 may transmit a signal relating to the distortion of the load current based on a detection signal relating to the distortion of the load current to a plurality of active filters 41 to 43 by using radio communication. Specifically, within the signal insulating unit 44A, the signal transmitting unit 44 transmits (transfers) a signal relating to the distortion of the load current by using radio communication, thereby electrically insulating the signal relating to the distortion of the load current and causing the multiple active filters 41 to 43 to acquire the signal (see first and second embodiments). Further, the signal transmitting unit 44 may directly transmit a signal relating to the distortion of the load current to the multiple active filters 41 to 43 by using radio communication by the radio transmitting circuit 44B (see the third embodiment).

For example, the signal transmitting unit 44 may convert a signal relating to the distortion of the load current based on a detection signal relating to the distortion of the load current, into an optical signal, and transmit the optical signal to the multiple active filters 41 to 43. Specifically, within the signal insulating unit 44A, the signal transmitting unit 44 may electrically insulate the signal relating to the distortion of the load current by converting the signal relating to the distortion of the load current into an optical signal and transmitting (transferring) the signal, and cause the multiple active filters 41 to 43 to acquire the signal (see first and second embodiments). Further, the signal transmitting unit 44 may convert the signal relating to the distortion of the load current into an optical signal by the optical conversion circuit 44C and transmit the optical signal directly to the multiple active filters 41 to 43 (see the fourth embodiment).

Further, for example, the signal transmitting unit 44 may perform differential amplification on a voltage corresponding to a signal relating to the distortion of the load current based on a detection signal relating to the distortion of the load current and cause the multiple active filters 41 to 43 to acquire the voltage.

As a result, the influence of the variation of the reference potential of each of the multiple active filters 41 to 43 on the operation of the multiple active filters 41 to 43 can be reduced.

[Variations/Modifications]

As described above, it is to be understood that various variations and modifications of modes and details are possible without departing from the purport and scope of the claims.

For example, in the above embodiment, the signal relating to the distortion of the load current transmitted from the signal transmitting unit 44 to each of the active filters 41 to 43 may include a signal relating to the compensation current for reducing the distortion of the load current. The signal relating to the compensation current may be, for example, a signal representing the compensation current required to reduce (cancel out) the current distortion (for example, harmonic components) in the current path between the AC power supply 10 and the load device 20. The signal relating to the compensation current may be, for example, a signal representing the spatial vector (correction vector) of the compensation current for each order of the harmonic components to be reduced in the compensation current. The signal relating to the compensation current may be, for example, a signal relating to each of the phase and amplitude for each order of the harmonic component to be reduced in the compensation current.

Finally, the present application claims priority based on Japanese Patent Application No. 2020-131882 filed on Aug. 3, 2020, and the entire contents of the Japanese patent application are hereby incorporated by reference.

REFERENCE SIGNS LIST 1 driving system
10 AC power supply
20 load device
30 load current sensor (detecting unit)
40 current distortion reduction apparatus
41, 42, 43 active filter (current distortion reduction unit)
44 signal transmitting unit (reference potential variation influence reduction unit)
44A signal insulating unit
44B radio transmitting circuit
44C optical conversion circuit
44D differential amplifier circuit
45 signal transmitting unit
45A signal insulating unit

The invention claimed is:

1. A current distortion reduction apparatus comprising:
a plurality of current distortion reduction units configured to reduce distortion of a load current supplied from an AC power supply to a predetermined load device, based on a detection signal output from a predetermined detecting unit, the detection signal relating to the distortion of the load current; and
a reference potential variation influence reduction unit configured to cause the plurality of current distortion reduction units to acquire a signal relating to the distortion of the load current, to reduce influence due to variation of a standard potential of the plurality of current distortion reduction units, based on the detection signal output from the predetermined detecting unit,
wherein the reference potential variation influence reduction unit electrically insulates the signal relating to the distortion of the load current based on the detection signal, and causes the plurality of current distortion reduction units to acquire the signal.

2. The current distortion reduction apparatus according to claim 1, wherein the reference potential variation influence reduction unit transmits the signal relating to the distortion of the load current based on the detection signal, to the plurality of current distortion reduction units by radio communication.

3. The current distortion reduction apparatus according to claim 1, wherein the reference potential variation influence reduction unit converts the signal relating to the distortion of the load current based on the detection signal, into an optical signal, and transmits the optical signal to the plurality of current distortion reduction units.

4. The current distortion reduction apparatus according to claim 1, wherein the reference potential variation influence reduction unit performs differential amplification on a voltage corresponding to the signal relating to the distortion of the load current based on the detection signal, and causes the plurality of current distortion reduction units to acquire the voltage.

5. The current distortion reduction apparatus according to claim 1, wherein the signal relating to the distortion of the load current is a signal representing the load current, a signal representing a sum of or a difference between phases of the load current, a signal relating to a distortion component of the load current, or a signal relating to a compensation current configured to reduce the distortion of the load current.

6. A current distortion reduction apparatus comprising:

a plurality of current distortion reduction units configured to reduce distortion of a load current supplied from an AC power supply to a predetermined load device, based on a detection signal output from a predetermined detecting unit, the detection signal relating to the distortion of the load current; and a reference potential variation influence reduction unit configured to cause the plurality of current distortion reduction units to acquire a signal relating to the distortion of the load current, to reduce influence due to variation of a standard potential of the plurality of current distortion reduction units, based on the detection signal output from the predetermined detecting unit, wherein the reference potential variation influence reduction unit converts the signal relating to the distortion of the load current based on the detection signal, into an optical signal, and transmits the optical signal to the plurality of current distortion reduction units.

7. A current distortion reduction apparatus comprising:

a plurality of current distortion reduction units configured to reduce distortion of a load current supplied from an AC power supply to a predetermined load device, based on a detection signal output from a predetermined detecting unit, the detection signal relating to the distortion of the load current; and a reference potential variation influence reduction unit configured to cause the plurality of current distortion reduction units to acquire a signal relating to the distortion of the load current, to reduce influence due to variation of a standard potential of the plurality of current distortion reduction units, based on the detection signal output from the predetermined detecting unit, wherein the reference potential variation influence reduction unit performs differential amplification on a voltage corresponding to the signal relating to the distortion of the load current based on the detection signal, and causes the plurality of current distortion reduction units to acquire the voltage.

* * * * *